United States Patent [19]

Fulling et al.

[11] Patent Number: 5,564,045

[45] Date of Patent: Oct. 8, 1996

[54] METHOD AND APPARATUS FOR STRING SEARCHING IN A LINKED LIST DATA STRUCTURE USING A TERMINATION NODE AT THE END OF THE LINKED LIST

[75] Inventors: Frank Fulling, Attleboro; Wayne M. DeMello, Newton, both of Mass.

[73] Assignee: Motorola, Inc., Schaumburg, Ill.

[21] Appl. No.: 281,946

[22] Filed: Jul. 28, 1994

[51] Int. Cl.⁶ ................................................ G06F 17/30
[52] U.S. Cl. .............. 395/600; 364/419.13; 364/DIG. 1; 364/282.1
[58] Field of Search .............................. 395/600; 341/51, 341/60; 364/419.13

[56] References Cited

U.S. PATENT DOCUMENTS 5,058,144  10/1991  Fiala et al. ............................. 375/122
5,123,061   6/1992  Pritchard ................................. 382/56
5,151,697   9/1992  Bunton ..................................... 341/51

Primary Examiner—Thomas G. Black
Assistant Examiner—John C. Loomis
Attorney, Agent, or Firm—Darleen J. Stockley

[57] ABSTRACT

A method and device provide a unique and efficient scheme for utilizing a linked list data structure for encoding and decoding user data, thereby improving the efficiency and speed of data communication. In addition, processor use for computation is minimized, throughput delay is minimized, and throughput performance is maximized in a data communication system.

19 Claims, 4 Drawing Sheets

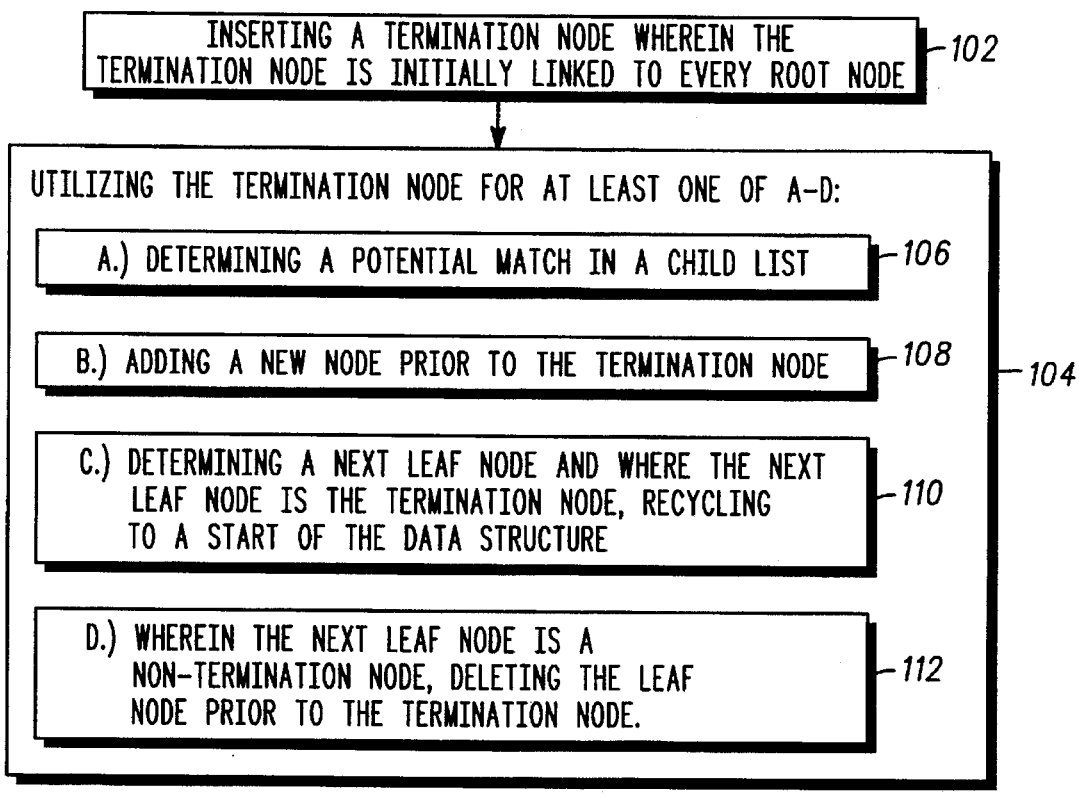
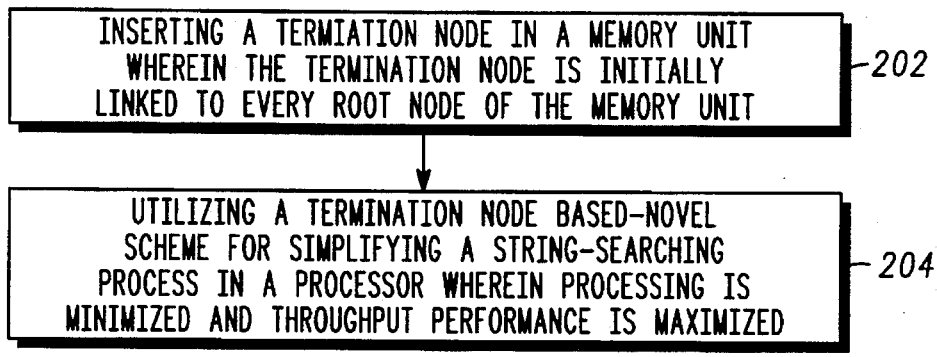

METHOD AND APPARATUS FOR STRING SEARCHING IN A LINKED LIST DATA STRUCTURE USING A TERMINATION NODE AT THE END OF THE LINKED LIST

FIELD OF THE INVENTION

This invention relates to data compression within data communication equipment and, more particularly, to data compression techniques for using data structures for efficient data compression.

BACKGROUND

Data storage and communication systems typically handle data that contains a significant amount of redundancy. Many techniques have been applied to decrease the amount of storage needed for data and the amount of essential data that needs to be transmitted to provide the initial data. Thus, modern techniques allow data to be transmitted in less time over a communications channel. It is common for compression to reduce the size of a data file by a 2:1 ratio or better.

In general, certain type-specific methods may be more efficient for particular file types than general algorithms. However, some type-specific methods require significant computational overhead in comparison with a general compression method. Some of the known compression techniques make implicit assumptions about the data being handled or a type of data file. For example, in video displays, there may be an assumption that only small portions of the video display will be changing, and it is only necessary to track the changes while retaining the unchanged portions.

The speed of compression and decompression is important in that a compression technique may not be acceptable if the computational overhead lowers the speed of communication sufficiently to cause degraded system performance. For example, run-length encoding takes advantage of repeated strings of a same character such as a space or zero. Thus, run-length coding encodes the repeated strings using an "escape" character, a repeat character, and the character to be repeated. Clearly, where characters are not repeated, the run-length coding is inefficient.

As more and more users implement data storage and data communication, there is a need for even more efficient data storage and faster data communication.

BRIEF DESCRIPTION OF THE DRAWINGS

FIG. 1 is a flow chart of one embodiment of steps in accordance with the method of the present invention.

FIG. 2 is a flow chart showing another embodiment of steps in accordance with the method of the present invention.

DETAILED DESCRIPTION OF A PREFERRED EMBODIMENT

Figure 3:
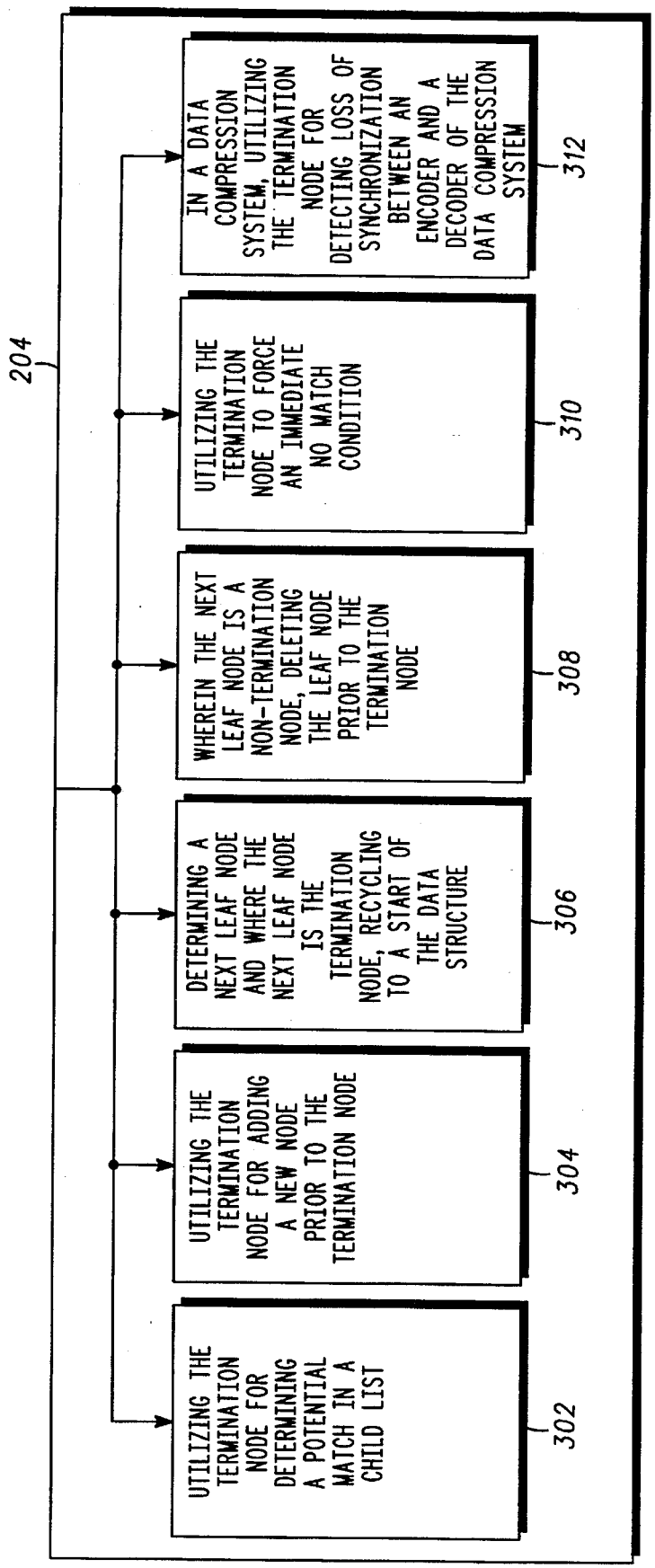
FIG. 3 is a diagram of alternate implementations of the termination node-based novel scheme in accordance with the present invention.

The present invention provides a method and device having a unique and efficient scheme for utilizing a linked list data structure for encoding and decoding user data, thereby improving the efficiency and speed of data communication. The method and device of the present invention minimize use of a processor for computation, minimize throughput delay, and maximize throughput performance of a data communication system.

V.42bis is a string compression algorithm for compressing data that uses a linked list data structure to build and maintain strings of user data. The present invention, by provision of a unique additional element provides efficient data compression in comparison with data compression using only a typical V.42bis linked list data structure. The unique additional element is defined as the "termination node". The termination node adds negligible overhead in terms of random access memory (RAM) requirements to an existing data structure. This invention also simplifies linked list maintenance and allows for reuse of data compression logic, thus eliminating exception processing. The simplification and reuse mentioned above reduces read only memory (ROM) requirements for V.42bis implementation. In addition, this invention allows for a proficient method of detecting loss of synchronization between an encoder and a decoder.

Typical operations within V.42bis are: searching a linked list, adding nodes to a linked list, finding leaf nodes within a linked list, and deleting leaf nodes from a linked list. The present invention improves the efficiency of each of these operations.

The search operation provides for searching a sequentially linked list, checking the character field of each node in the linked list for a match with the input character. The search operation utilizes repetitive logic which checks a node for a match and in the case of a no match, moves sequentially to the next node to continue searching. Typically, the search operation checks for a potential match condition as well as a condition which indicates the end of the linked list. Provision of a termination node allows for a potential match condition check to be sufficient in terminating the search logic. Since the linked list is a lexicographically ordered list, the search operation can be terminated once a node is found that contains a character in the character field which is greater than or equal to the input character. The termination node is initialized to contain a character in the character field which is larger than all possible input characters, where a character equals 8 bits. In turn, with this invention, the termination node always resides at the end of the lexicographically linked list. This positioning of the termination node guarantees the search operation will terminate after finding a node in the linked list which is greater than or equal to the input character without going off the end of the linked list. The elimination of the end of the linked list check simplifies the logic and decreases processing time per input character.

When a no match situation results from the search operation described above, typically the input character is used to create a new node which is added to the linked list being searched. The new node is added to the linked list in the correct lexicographical order. Typically, there are three add cases which can occur. The new node may need to be added as the first node in the list, between the first and the last node in the list, or as the last node in the list. Each of these add cases requires unique logic for modifying the appropriate links to add the new node. Using the termination node eliminates one of the three add cases, specifically, the adding of the last node case. Addition of the last node is no longer necessary since the termination node will always be the last node in any linked list. The elimination of addition of a last node simplifies the logic/reduces read-only-memory (ROM) requirements and decreases processing time per input character.

Within the constraints of V.42bis, whenever a new node is added, another node must be deleted. The node to delete is selected by finding the next sequential leaf node. A leaf node is a node which does not have a linked list of children. The find leaf node operation is repetitive in nature, checking consecutive nodes until a leaf node is found. Typically, this logic has two conditions which must be checked. The logic must check if the node is a leaf node and must also check to see if the end of the data structure has been reached. In the present invention, the latter check can be eliminated due to the use of the termination node since the termination node resides as the last node in the entire data structure. Also, the termination node is itself a leaf node. This guarantees that the find leaf operation will always find a leaf, eliminating any additional check for the end of the data structure within the repetitive logic. The elimination of the check for a last node simplifies the logic/reduces ROM requirements and decreases processing time per input character.

After a leaf node has been selected, the leaf node must be deleted from its linked list. The node to be deleted may be the first node in the list, between the first and the last node in the list, or the right most node in the list. Each of these delete cases requires unique logic for modifying the appropriate links to delete the node. The termination node eliminates one of the three cases. Specifically, the deleting of the last node case is no longer necessary, since the termination node will always be the last node in any linked list. The elimination of this case simplifies the logic/reduces ROM requirements and decreases processing time per input character.

The termination node may also be used to force an immediate no match condition by starting the search from the termination node itself, which is desirable for several reasons within the scope of V.42bis. By starting the search from the termination node, an immediate no match condition is guaranteed since the termination node is a leaf node. By guaranteeing a no match condition for a given input character, the need for unique, extra logic to ensure a no match condition is eliminated. Thus, the use of the termination node simplifies the logic and decreases processing time per input character by guaranteeing a no match condition.

In addition, the termination node can be used as a proficient method for detecting loss of synchronization between the encoder and the decoder. Typically, a decoder will receive codewords from an encoder, where the codewords represent strings of characters within the decoder's linked list data structure. In order to detect loss of synchronization between the encoder and the decoder, the decoder may monitor for certain error conditions. One of these conditions may be the receipt of a codeword representing an unlinked node. By having all unlinked nodes linked to the termination node, a decoder can immediately detect this error condition and take appropriate actions in response to the loss of synchronization.

FIG. 1, numeral 100, is a flow chart of one embodiment of steps in accordance with the method of the present invention. The method provides for string searching in a data compression system for efficiently using and maintaining a linked list data structure for input characters. The method includes the steps of: A) inserting a termination node wherein the termination node is linked to every root node (102); and B) utilizing the termination node (104) for at least one of 1–4: 1) determining a potential match in a child list (106); 2) adding a new node prior to the termination node (108); 3) determining a next leaf node and where the next leaf node is the termination node, recycling to a start of the data structure (110); and 4) wherein the next leaf node is a non-termination node, deleting the leaf node prior to the termination node (112).

FIG. 2, numeral 200, is a flow chart showing another embodiment of steps in accordance with the method of the present invention. The string searching method efficiently uses and maintains a linked list data structure for input characters in a data compression structure and includes the steps of: A) inserting a termination node in a memory unit wherein the termination node is linked to every root node of the memory unit (202); B) utilizing a termination node-based novel scheme for simplifying a string-searching process in a processor wherein processing is minimized and throughput performance is maximized (204).

As shown in FIG. 3, numeral 300, the termination node-based novel scheme may be selected to include at least one of: utilizing the termination node for determining a potential match in a child list (302); utilizing the termination node for adding a new node prior to the termination node (304); determining a next leaf node and where the next leaf node is the termination node, recycling to a start of the data structure (306); wherein the next leaf node is a non-termination node, deleting the leaf node prior to the termination node (308); utilizing the termination node to force an immediate no-match condition (310); and in a data compression system, utilizing the termination node for detecting loss of synchronization between an encoder and a decoder of the data compression system (312).

Figure 4:
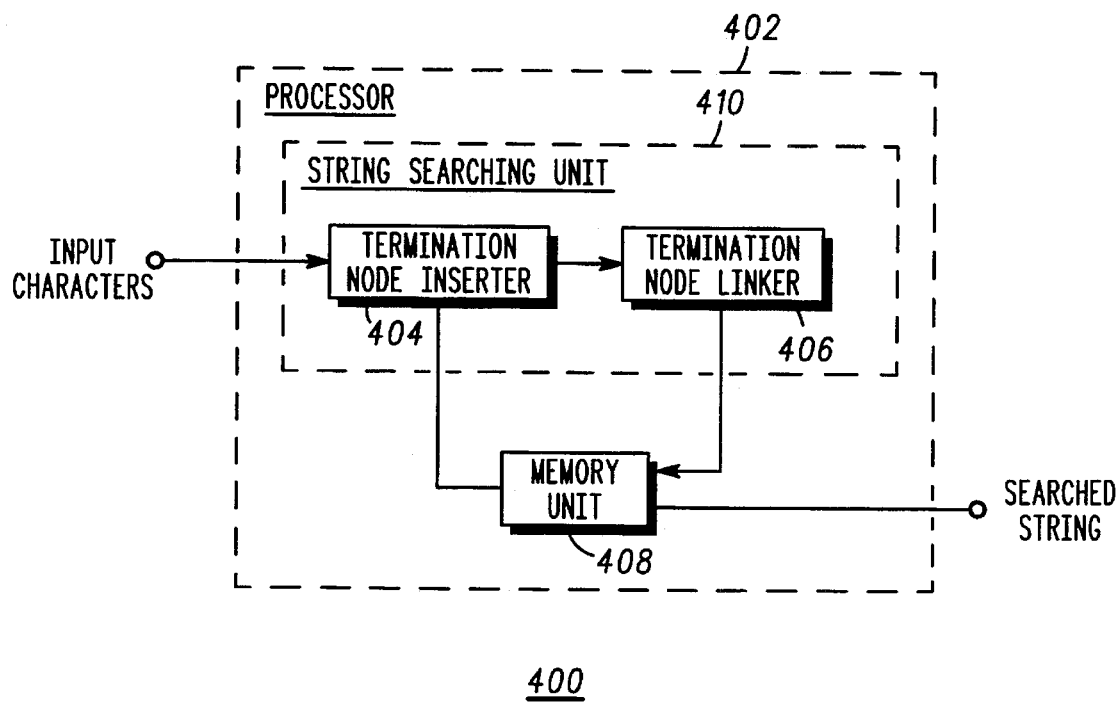
FIG. 4 is a block diagram of a string searching device in a processor for processing input characters and efficiently using and maintaining a linked list data structure in accordance with the present invention.

FIG. 4, numeral 400, is a block diagram of a string searching device in a processor (402) for processing input characters and efficiently using and maintaining a linked list data structure in accordance with the present invention. The string searching device (410) includes: A) a termination node inserter (404) for determining a termination node in a memory unit (408) wherein the termination node is linked initially to every root node of the memory unit (408) for facilitating string-searching, and B) a termination node linker (406), operably coupled to the termination node inserter (404) and to the memory unit (408), for linking the termination node to a string-searching data structure for simplifying a string-searching process in a processor wherein processing is minimized and throughput performance is maximized.

The processor with the string searching unit (410) typically includes a string searching unit (410), operably coupled to the termination node linker (406) and the termination node inserter (404), for at least one of: utilizing the termination node for determining a potential match in a child list; utilizing the termination node for adding a new node prior to the termination node; determining a next leaf node and where the next leaf node is the termination node, recycling to a start of the data structure; wherein the next leaf node is a non-termination node, deleting the leaf node prior to the termination node; utilizing the termination node to force an immediate no-match condition; and in a data compression system, utilizing the termination node for detecting loss of synchronization between an encoder and a decoder of the data compression system.

Figure 5:
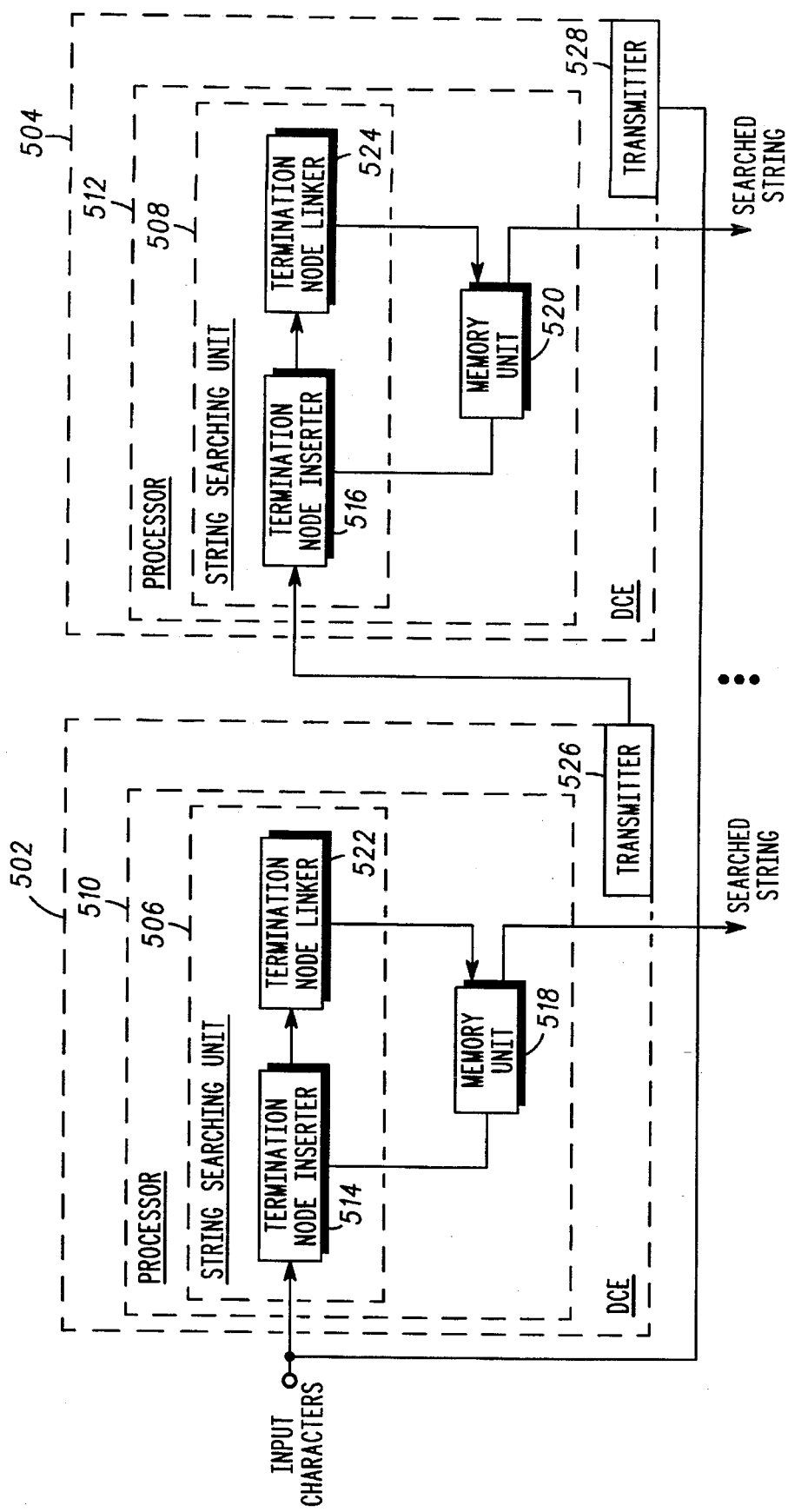
FIG. 5 is a block diagram of one embodiment of a data communication system that includes a plurality of data communication equipment, each having a string searching device in a processor for processing input characters and efficiently using and maintaining a linked list data structure in accordance with the present invention.

FIG. 5, numeral 500, is a block diagram of one embodiment of a data communication system that includes a plurality of data communication equipment (502, 504, ...), each having a string searching device (506, 508, ...) in a processor (510, 512, ...) for processing input characters and efficiently using and maintaining a linked list data structure in accordance with the present invention. The string searching device (506, 508, ...) includes a termination node inserter (514, 516, ...) for determining a termination node in a memory unit (518, 520, ...) wherein the termination node is positioned at an end of a string-searching data structure to provide for a leaf node as a last node in the data structure for facilitating string-searching, and a termination node linker (522, 524, ...), operably coupled to the termination node inserter (514, 516, ...), for linking the termination node to a string-searching data structure for simplifying a string-searching process in a processor wherein processing is minimized and throughput performance is maximized. Each DCE (502, 504, ...) also has a transmitter (526, 528, ...) for transmitting input characters to another DCE. The string searching device is as described in more detail above.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

We claim:

1. An efficient string searching method in a data compression system for efficiently using and maintaining a linked list data structure for input characters, comprising the steps of:
    A) searching a sequentially linked list;
    B) checking a character field of each node in the linked list for a match with an input character;
    C) utilizing repetitive logic to check each node for a match and in the case of a non-match, moving sequentially to a next node to continue searching, and where selected, checking for a condition which indicates an end of the linked list;
    D) providing a termination node at an end of the linked list, wherein the termination node is initialized to contain a character in the character field that is larger than a predeterminimed maximum number of input characters, to provide for a potential match condition check to be sufficient in terminating the search logic;
    E) One Of E1–E2:
        E1) terminating when a node is found that contains a character in the character field which is greater than or equal to the input character; and
        E2) using, when a no match results from the search operation, the input character to provide a new node which is added to the linked list being searched in a lexicographical order wherein the new node is added as one of: a first node in the list and between the first node and a last node in the list using unique logic for modifying links to add the new node;
    F) deleting, when the new node is added, another node by checking consecutive nodes until a leaf node is found and deleting the leaf node from its linked list.

2. A string searching method in a data compression system for efficiently using and maintaining a linked list data structure for input characters, comprising the steps of:
    A) inserting a termination node in a memory unit wherein the termination node is initially linked to every root node of the memory unit,
    B) utilizing a termination node-based novel scheme for simplifying a string-searching process in a processor wherein processing is minimized and throughput performance is maximized wherein the termination node-based novel scheme includes utilizing the termination node for determining a potential match in a linked list, adding a new node prior to the termination node, and determining a next leaf node and where the next leaf node is the termination node, recycling to a start of the data structure.

3. The string searching method of claim 2 wherein the termination node-based novel scheme includes, wherein the next leaf node is a non-termination node, deleting the leaf node prior to the termination node.

4. The string searching method of claim 2 wherein the termination node-based novel scheme includes utilizing the termination node to force an immediate no-match condition.

5. The string searching method of claim 2 wherein the termination node-based novel scheme includes, in a data compression system, utilizing the termination node for detecting loss of synchronization between an encoder and a decoder of the data compression system.

6. A string searching device in a processor for processing input characters and efficiently using and maintaining a linked list data structure, comprising:
    A) a termination node inserter for determining a termination node in a memory unit wherein the termination node is positioned at an end of a string-searching data structure to provide for a leaf node as a last node in the data structure for facilitating string-searching wherein determining includes utilizing the termination node for determining a potential match in a linked list, adding a new node prior to the termination node, and determining a next leaf node and where the next leaf node is the termination node, recycling to a start of the data structure, and
    B) a termination node linker, operably coupled to the termination node inserter and to the memory unit, for linking the termination node to a string-searching data structure for simplifying a string-searching process in a processor wherein processing is minimized and throughput performance is maximized.

7. The string searching device of claim 6 wherein the processor further includes a string searching unit, operably coupled to the termination node linker and the termination node inserter, for utilizing the termination node for determining a potential match in a linked list.

8. The string searching device of claim 6 wherein the processor further includes a string searching unit, operably coupled to the termination node linker and the termination node inserter, for utilizing the termination node for adding a new node prior to the termination node.

9. The string searching device of claim 6 wherein the processor further includes a string searching unit, operably coupled to the termination node linker and the termination node inserter, for determining a next leaf node and where the next leaf node is the termination node, recycling to a start of the data structure.

10. The string searching device of claim 6 wherein the processor further includes a string searching unit, operably coupled to the termination node linker and the termination node inserter, for, wherein the next leaf node is a non-termination node, deleting the leaf node prior to the termination node.

11. The string searching device of claim 6 wherein the processor further includes a string searching unit, operably coupled to the termination node linker and the termination node inserter, for utilizing the termination node to force an immediate no-match condition.

12. The string searching device of claim 6 wherein the processor further includes a string searching unit, operably coupled to the termination node linker and the termination node inserter, for, in a data compression system, utilizing the termination node for detecting loss of synchronization between an encoder and a decoder of the data compression system.

13. A data communications system comprising a plurality of data communications equipment, each having a string searching device in a processor for processing input characters from a transmitter of another data communications equipment and efficiently using and maintaining a linked list data structure, the string searching device comprising:

A) a termination node inserter for determining a termination node in a memory unit wherein the termination node is positioned at an end of a string-searching data structure to provide for a leaf node as a last node in the data structure for facilitating string-searching, wherein determining includes utilizing the termination node for determining a potential match in a linked list, adding a new node prior to the termination node, and determining a next leaf node and where the next leaf node is the termination node, recycling to a start of the data structure and B) a termination node linker, operably coupled to the termination node inserter, for linking the termination node to a string-searching data structure for simplifying a string-searching process in a processor wherein processing is minimized and throughput performance is maximized.

14. The data communications equipment of claim 13 wherein the processor further includes a string searching unit, operably coupled to the termination node linker and the termination node inserter, for utilizing the termination node for determining a potential match in a child list.

15. The data communications equipment of claim 13 wherein the processor further includes a string searching unit, operably coupled to the termination node linker and the termination node inserter, for utilizing the termination node for adding a new node prior to the termination node.

16. The data communications equipment of claim 13 wherein the processor further includes a string searching unit, operably coupled to the termination node linker and the termination node inserter, for determining a next leaf node and where the next leaf node is the termination node, recycling to a start of the data structure.

17. The data communications equipment of claim 13 wherein the processor further includes a string searching unit, operably coupled to the termination node linker and the termination node inserter, for, wherein the next leaf node is a non-termination node, deleting the leaf node prior to the termination node.

18. The data communications equipment of claim 13 wherein the processor further includes a string searching unit, operably coupled to the termination node linker and the termination node inserter, for utilizing the termination node to force an immediate no-match condition.

19. The data communications equipment of claim 13 wherein the processor further includes a string searching unit, operably coupled to the termination node linker and the termination node inserter, for, in a data compression system, utilizing the termination node for detecting loss of synchronization between an encoder and a decoder of the data compression system.

* * * * *